United States Patent [19]

Imai

[11] Patent Number: 5,033,068
[45] Date of Patent: Jul. 16, 1991

[54] CHARGE TRANSFER DEVICE

[75] Inventor: Shin-ichi Imai, Yokohama, Japan

[73] Assignee: Kabushiki Kaisha Toshiba, Kawasaki, Japan

[21] Appl. No.: 196,216

[22] Filed: May 19, 1988

[30] Foreign Application Priority Data

May 21, 1987 [JP] Japan .................. 62-124608

[51] Int. Cl.⁵ .................. G11C 19/28; H01L 29/78
[52] U.S. Cl. .................. 377/60; 377/58; 307/353; 307/482; 307/578; 357/24
[58] Field of Search ........... 377/57, 58, 60, 61–63; 357/24; 307/270, 450, 482, 578, 353

[56] References Cited

U.S. PATENT DOCUMENTS

| | | | |
|---|---|---|---|
| 4,074,206 | 2/1978 | Horninger | 377/60 |
| 4,099,175 | 7/1978 | Rubin | 377/60 |
| 4,140,927 | 2/1979 | Feucht | 307/448 |
| 4,250,406 | 2/1981 | Alaspa | 307/452 |
| 4,459,497 | 7/1984 | Kuo et al. | 307/530 |
| 4,528,684 | 7/1985 | Iida et al. | 377/60 |
| 4,625,322 | 11/1986 | Tukazaki et al. | 307/353 |
| 4,627,083 | 12/1986 | Pelgrom et al. | 377/60 |
| 4,725,746 | 2/1988 | Segawa et al. | 307/482 |
| 4,809,307 | 2/1989 | Sakaue et al. | 377/60 |
| 4,811,371 | 3/1989 | Tower | 357/24 |

FOREIGN PATENT DOCUMENTS

| | | | |
|---|---|---|---|
| 0095820 | 2/1980 | Japan | 377/60 |
| 59-11680 | 1/1984 | Japan . | |
| 0097229 | 6/1984 | Japan | 307/475 |
| 59-132668 | 7/1984 | Japan . | |
| 0223161 | 11/1985 | Japan | 357/24 |
| 61-216473 | 9/1986 | Japan . | |
| 0216475 | 9/1986 | Japan | 357/24 |

*Primary Examiner*—Stanley D. Miller
*Assistant Examiner*—Tai V. Duong
*Attorney, Agent, or Firm*—Finnegan, Henderson, Farabow, Garrett and Dunner

[57] ABSTRACT

In a charge transfer device, the threshold voltage of a drive MOS transistor in an output circuit is set to be largest among those of MOS transistors of the same conductivity type which are formed on a substrate. Even under a large reset pulse, the MOS transistor is operable in a saturation region, because its threshold voltage is set to be large.

16 Claims, 5 Drawing Sheets

CHARGE TRANSFER DEVICE

BACKGROUND OF THE INVENTION

1. Field of the Invention

This invention relates to a charge transfer device used for solid state image pick-up devices, and the delay lines, comb type filters and transversal filters of the charge transfer type, and more particularly to a charge transfer device with an improved output circuit which is for converting a signal charge into a signal voltage.

2. Description of the Related Art

Recently, charge transfer devices have widely been used in video devices, such as televisions, video disk players (VDPs), and video tape recorders (VTRs), due to their excellent broad band characteristics and delay characteristics. One of the known signal outputting systems used as the output circuit of the CTD is a floating diffusion system. FIG. 1 shows a circuit arrangement of a conventional CTD based on the floating diffusion system. In the figure, reference numerals 61 to 64 show respectively transfer electrodes provided in a charge transfer section. For sequentially transferring signal charges in this section, a pair of electrodes 61 and 62 are driven by transfer pulse $\phi 1$, and another pair of electrodes 63 and 64 are driven by another transfer pulse $\phi 2$. The signal charges are transferred through the semiconductor region under these electrodes 61 to 64, and then pass through output gate electrode 65 and enter floating diffusion region 66. Floating diffusion region 66 is connected to output circuit 69 of the source follower type, which is made up of enhancement type (E type) MOS transistor 67 and power source 68. Output circuit 69 converts the signal charge into a signal voltage VO, and outputs it as an output signal. After the voltage signal is output from output circuit 69, reset gate electrode 70, which is provided adjacent to floating diffusion region 66 and is under control of reset pulse $\phi R$, is enabled, so that the signal charges are discharged as unnecessary charges into drain region 71.

In recent portable VTRs there is a tendency to use a low voltage, e.g., 5 V, for the power source voltage in the circuit system. This tendency demands that the CTDs be operable at low voltage. However, the output circuit of the CTD must operate with good linearity.

To maintain good linearity of output circuit 69, transistor 67 must operate in a saturation region. To this end, the following relation shall be satisfied $$VGG - \Delta VFD + \Delta V - VTH < VDD, \quad (1)$$

where
- VGG: reset voltage applied to drain region 71,
- VDD: power source voltage of output circuit 69,
- $\Delta VFD$: DC bias component of the signal charge transferred to floating diffusion region 66,
- $2\Delta V$: AC signal component of the charges to be transferred to said floating diffusion region,
- VTH: threshold voltage of drive MOS transistor 67.

An attempt to realize a floating diffusion type CTD operable at a low voltage, will encounter the following problem. The amount of charge contained in the output section including floating diffusion region 66 and drain region 71, is reduced, so that the dynamic range of the CTD is narrowed. To cope with this, a pulled-up high voltage relative to power source voltage VDD is used for the reset voltage VGG applied to drain region 71.

If such a pulled-up voltage is used for reset voltage VGG, it is difficult to satisfy the relation (1). Hence, transistor 67 operates in a nonsaturation region and the CTD output circuit operates nonlinearly.

As described above, in the conventional CTD, if attempt is made to reduce the power source voltage with a satistactory dynamic range, the linearity of the output circuit is damaged.

SUMMARY OF THE INVENTION

Accordingly, an object of this invention is to provide a charge transfer device which is operable at a low power source voltage while keeping satisfactory dynamic range and linearity.

To achieve the above object, a charge transfer device is arranged such that the threshold voltage of a drive MOS transistor in an output circuit is set to be the largest of those of MOS transistors of the same conductivity type formed on the same substrate.

Even under a large reset pulse, the MOS transistor is operable in a saturation region, because its threshold voltage is set to be large.

According to the present invention, there is provided a charge transfer device comprising:

a floating diffusion region formed on a semiconductor substrate, signal charge being transferred from said charge transfer section to said floating diffusion region;

a drain region formed on the semiconductor substrate, and said drain region draining unnecessary signal charges in response to a reset voltage;

reset means formed between said floating diffusion region and said drain region on the semiconductor substrate, said reset means discharging the charges stored in said floating region into said drain region in response to a reset pulse applied thereto;

an output circuit of the source-follower type including a drive MOS transistor of the enhancement type formed on the semiconductor substrate, the gate of said drive MOS transistor being connected to said floating diffusion region, said output circuit further including a current source formed on the semiconductor substrate and connected to the source of said drive MOS transistor, said output circuit converting an amount of the charges stored in said floating diffusion region into a voltage value; and the threshold voltage of said drive MOS transistor in said output circuit being set to be largest among those of the MOS transistors of the same conductivity type formed on the semiconductor substrate.

According to the present invention, there is further provided a charge transfer device comprising:

a floating diffusion region formed on a semiconductor substrate, signal charge being transferred from said charge transfer section to said floating diffusion region;

a drain region formed on the semiconductor substrate, said drain region draining unnecessary signal charges in response to a reset voltage;

reset means formed between said floating diffusion region and said drain region on the semiconductor substrate, said reset means discharging the charges stored in said floating region into said drain region in response to a reset pulse applied thereto;

an output circuit of the source-follower type including a drive MOS transistor of the enhancement type formed on the semiconductor substrate, the gate of said drive MOS transistor being connected to said floating diffusion region, said output circuit further including an enhancement type MOS transistor for current source/- load on the semiconductor substrate and connected to the source of said drive MOS transistor, said output circuit converting an amount of the charges stored in said floating diffusion region into a voltage value; and the threshold voltage of said drive MOS transistor in said output circuit being set to be larger than that of said current source/load MOS transistor.

DETAILED DESCRIPTION OF THE PREFERRED EMBODIMENTS

Some preferred embodiments of a charge transfer device (CTD) according to this invention will be described referring to the accompanying drawings.

Figure 1:
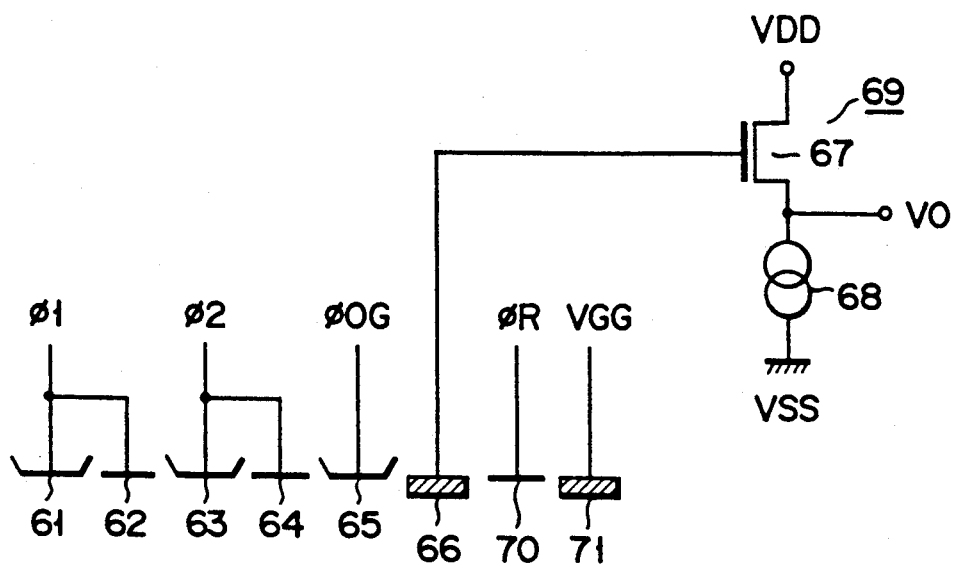
FIG. 1 is a circuit diagram of a conventional CTD.
Figure 2:
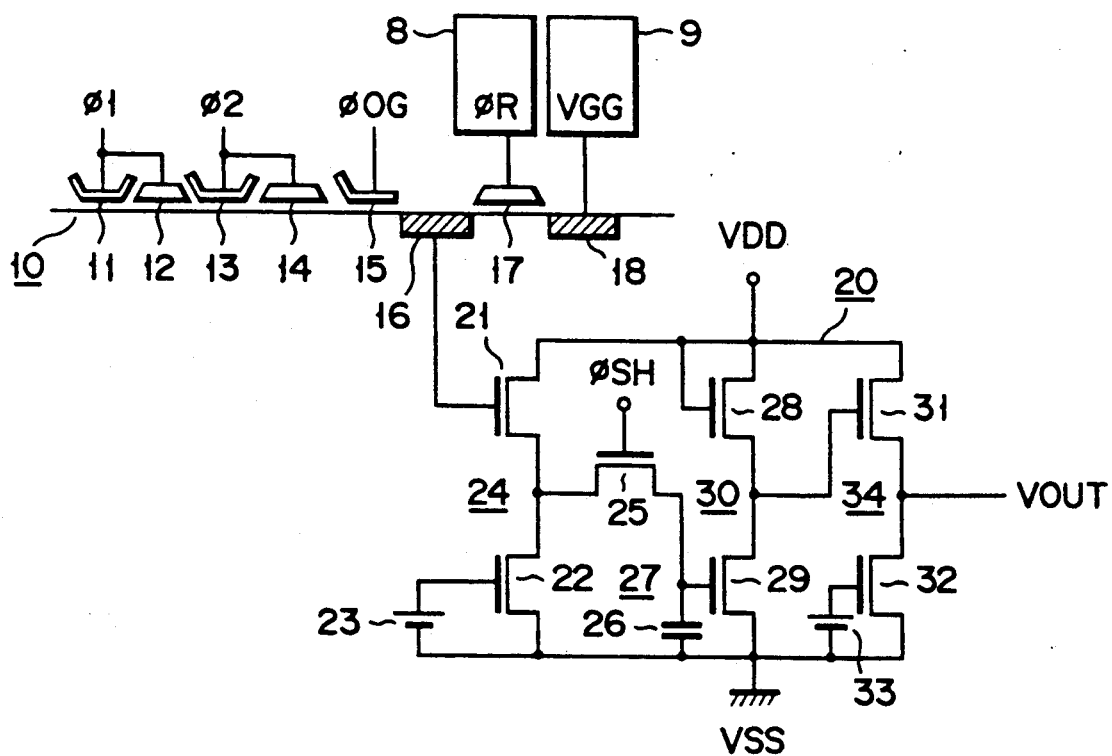
FIG. 2 is a circuit diagram of a charge transfer device according to an embodiment of this invention.

FIG. 2 shows a circuit arrangement of a CTD according to this invention. In the figure, reference numerals 11 to 14 show respectively transfer electrodes provided in a charge transfer section. These transfer electrodes 11 to 14 are made of two-layered polysilicon layers. Output gate electrode 15 is provided adjacent to the final stage electrode 14. Floating diffusion region 16 is formed adjacent to this output gate electrode 15 on semiconductor substrate 10. Reset gate electrode 17 is provided close to this floating diffusion region 16. Further, drain region 18 is located near the reset gate electrode 17. Transfer electrodes 11 and 12 are coupled for reception with transfer pulse $\phi 1$, and transfer electrodes 13 and 14 receive transfer pulse $\phi 2$. Output pulse $\phi OG$ is applied to output gate electrode 15. Reset pulse $\phi R$ varying between high and low voltages is applied to reset gate electrode 17. Reset voltage VGG, which is pulled up with respect to power source voltage VDD is supplied to drain region 18.

Floating diffusion region 16 is connected to output circuit 20 for detecting signal charges to be stored therein. In this output circuit 20, the source-drain paths of two MOS transistors 21 and 22 are connected in series and inserted between power source voltages VDD and VSS. The gate of transistor 21 is connected to floating diffusion region 16. Constant voltage source 23 is connected between the gate of transistor 22 and power source voltage VSS. Transistors 21 and 22 make up a source-follower type amplifier (impedance/level converter) 24. In this case, transistor 21 serves as a drive transistor, and transistor 22 as a constant current source. The amplifier 24 inverts the charges stored in floating diffusion region 16 into a signal voltage. The source-follower amplifier 24 is followed by sample/hold circuit 27 made up of MOS transistor 25 coupled at the gate with sampling pulse $\phi SH$ and capacitor 26. The signal voltage from amplifier 24 is stored into capacitor 26 of sample/hold circuit 27, in synchronism with sampling pulse $\phi SH$. Sample/hold circuit 27 is followed by inverter 30 comprised of MOS transistor 28 as a load transistor and a MOS transistor 29 as a drive transistor. The voltage held in this sample/hold circuit 27 is inverted and amplified by inverter 30. Inverter 30 is followed by source-follower type amplifier 34, which includes transistors 31 and 32 and constant voltage source 33. This amplifier 34 has the same arrangement as that of amplifier 24. The voltage as inverted and amplified by inverter 30 is amplified by amplifier 34, and output as output voltage VOUT.

All of the above circuits are formed on the same semiconductor substrate. The MOS transistors 21, 22, 25, 28, 29, 31 and 32 are all of the E type, and the N channel type. The threshold voltages of transistors other than transistor 21 are set at VTH1. The threshold voltage of transistor 21 is set at VTH2 that is higher than threshold voltage VTH1. It is inevitable that there are slight differences among the MOS transistors due to the differences of the channel length L and the channel width W of those transistors. The threshold voltage VTH2 is set so as to satisfy the following relation $$VGG - \Delta VFD + \Delta V - VTH2 < VDD \quad (2)$$

Figure 3A:
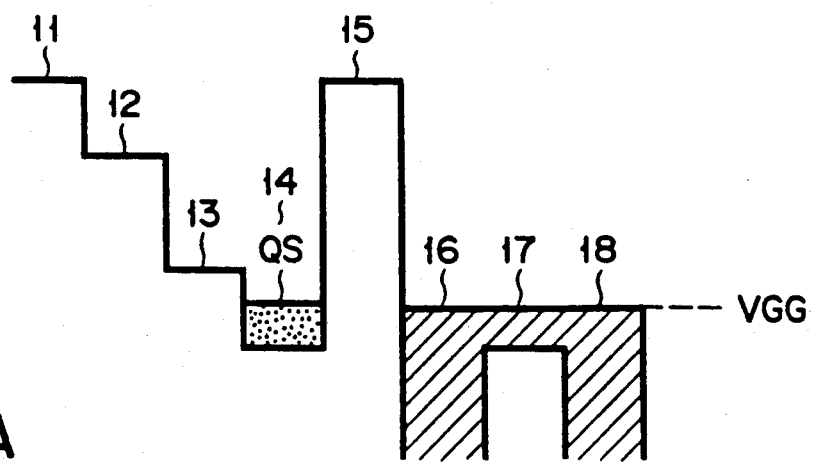
FIGS. 3A and 3B show potential profiles in the CTD of FIG. 2.
Figure 3B:
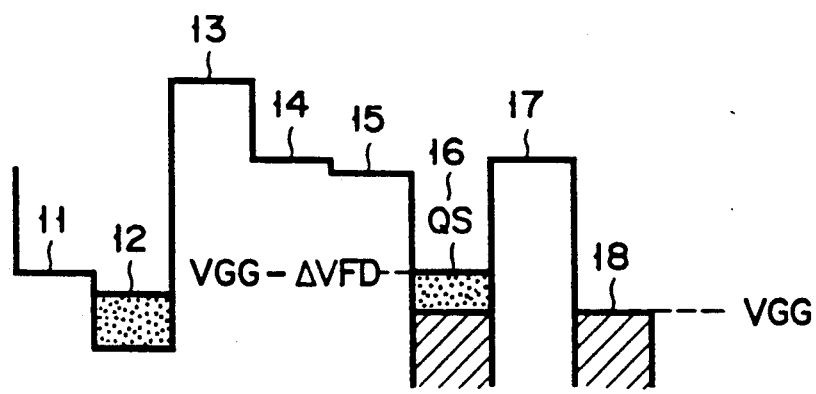

The operation of the CTD thus arranged will be described using the potential profiles shown in FIGS. 3A and 3B.

In a charge reset mode, transfer pulse $\phi 1$ applied to transfer electrodes 11 and 12 and output pulse $\phi OG$ applied to output gate electrode 15 are both at low voltage, and transfer pulse $\phi 2$ applied to transfer electrodes 13 and 14 and reset pulse $\phi R$ applied to reset ate electrode 17 are both at high voltage. As shown in FIG. 3A, signal charge QS transferred to the charge transfer section is stored in the semiconductor region under transfer electrode 14. At the same time, floating diffusion region 16 is reset by reset voltage VGG.

In a charge detecting mode, transfer pulse $\phi 1$ and output pulse $\phi OG$ are both at high voltage, while transfer pulse $\phi 2$ and reset pulse $\phi R$ are both at low voltage. Under this condition, as shown in FIG. 3B, the signal charge QS stored in the semiconductor region under transfer electrode 14 is transferred to floating diffusion region 16 via the semiconductor region under output gate electrode 15. The transferred signal charge QS causes a potential variation in floating diffusion region 16. This potential variation is detected by output circuit 20 and is output as voltage signal VOUT from the output circuit.

To linearly operate source-follower type amplifier 24 at the first stage in output circuit 20, transistor 21 must always operate in a saturation region. To this end, the following relation must hold $$VFD - VTH2 < VDD \quad (3)$$

where VFD is the voltage in floating diffusion region 16 when it is storing signal charges QS. If the voltage variation in floating diffusion region 16 due to signal charge QS is 2ΔV, the voltage VFD in the floating diffusion region is $$VFD = VGG - \Delta VFD + \Delta V \quad (4)$$

When combining relations (3) and (4), we have $$VTH2 > VGG - \Delta VFD + \Delta V - VDD \quad (5)$$

The threshold voltage VTH2 expressed by relation (5) satisfies the relation (2). This indicates that the CTD of this embodiment may keep the linearity of amplifier 24 even if reset voltage VGG is set high. The high voltage VGG enables the dynamic range of the output circuit to be wide.

When the pulled-up reset voltage VGG applied to drain region 18 is pulled up by the bootstrap circuit formed on the same substrate, this voltage VGG varies with the process parameter variations. Therefore, the threshold voltage of transistor 21 must be selected allowing for the variation of voltage VGG.

To set the threshold voltage VTH2 of transistor 21 to be higher than the threshold voltage VTH1 of other transistors, additional use of the lithography process only for this transistor 21 suffices.

Figure 4:
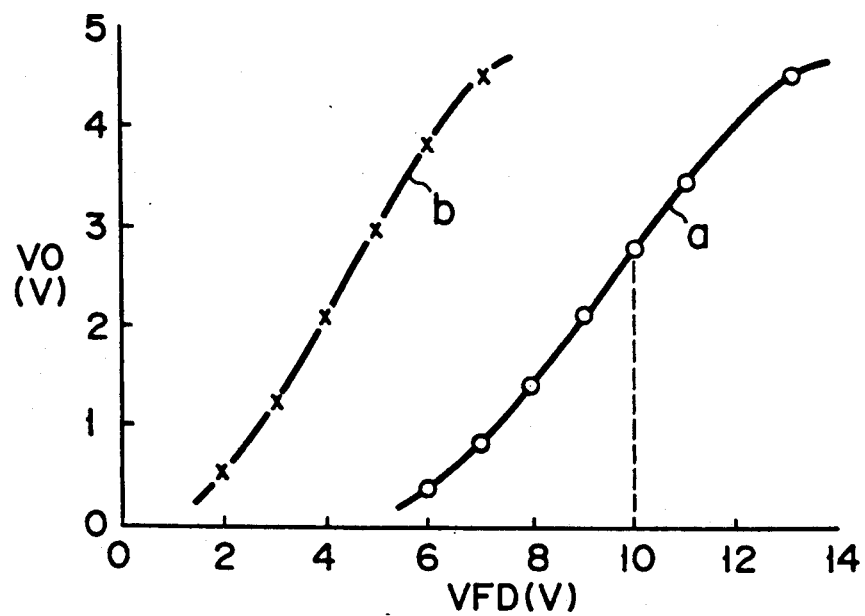
FIG. 4 comparatively shows input-output characteristics of the output circuit of the conventional CTD and a source-follower amplifier as the output circuit of the CTD of this invention.

Turning now to FIG. 4, there are shown two curves. These curves indicate respectively the input vs. output characteristic of the output circuit of the conventional CTD, and that of the source-follower amplifier 24 or 34 of the CTD of this embodiment. These curves are plotted at 5 V of power source VDD. To operate the CTD at low voltage, reset voltage VGG is pulled up and the voltage VFD in the floating diffusion region is at approximately 10 V. When looking at the extension of curve B in the vicinity of this 10 V of floating diffusion region voltage VDF, a nonlinearity can easily be anticipated. On the other hand, the curve A of this embodiment linearly varies in this region of 10 V. The graph clearly implies that the conventional CTD operates nonlinearly, but the CTD of this embodiment operates linearly.

Figure 5:
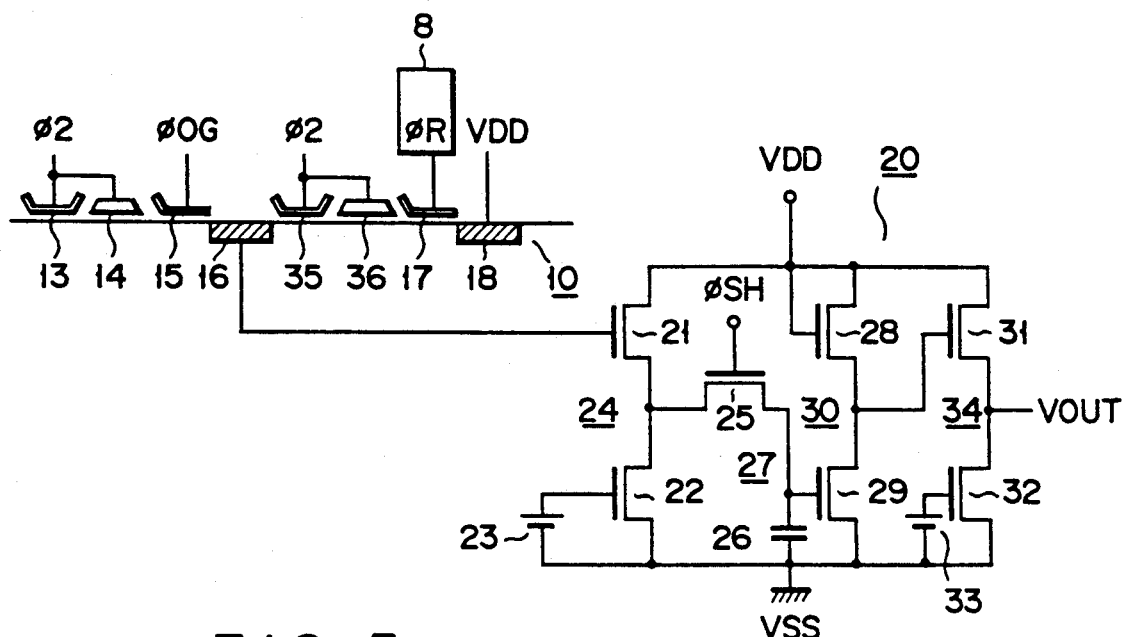
FIG. 5 is a circuit diagram of a CTD according to another embodiment of this invention.

FIG. 5 shows another embodiment of a CTD according to this invention. While in the FIG. 2 embodiment, reset voltage VGG, which is pulled up and higher than power source voltage VDD, is applied to drain region 18, in this second embodiment power source voltage VDD is applied to the drain region. In the second embodiment, the transfer electrodes 11 and 12 under control of transfer pulse φ1 are omitted. Transfer electrodes 35 and 36, which are controlled by transfer pulse φ2 are additionally inserted between floating diffusion region 16 and reset gate electrode 17.

In the CTD of FIG. 5 thus arranged, the voltage VFD in floating diffusion region 16 is considerably higher than voltage VFD of FIG. 2. For this reason, as in the first embodiment of FIG. 2, the threshold voltage VTH2 of drive MOS transistor 21 of source follower amplifier 24 at the first stage in output circuit 20 is set to be higher than that of other transistors, so that transistor 21 operates in a saturation region. In the case where two transfer electrodes 35 and 36 supplied with transfer pulse φ2 are located between floating diffusion region 16 and reset gate electrode 17, as in this embodiment, a pulled-up voltage must be applied to drain region 18 if the threshold voltage of D type MOS transistor constituting the CTD is in a specific region of voltage values.

Figure 6:
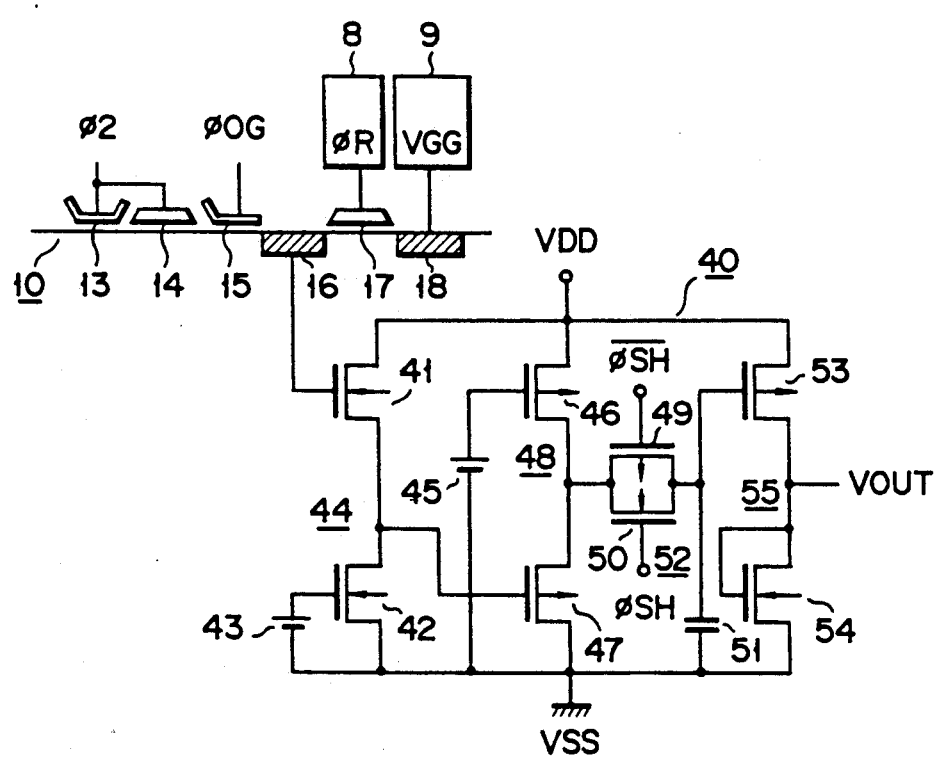
FIG. 6 is a circuit diagram of a CTD according to yet another embodiment of this invention.

An additional embodiment of a CTD according to this invention is shown in FIG. 6. In the embodiments of FIGS. 2 and 5 as mentioned above, this invention is applied for the CTDs which use the N channel MOS structure for the output circuit. The embodiment of FIG. 6 uses CMOS structure for the output circuit. In output circuit 40, the source-drain paths of N channel MOS transistors 41 and 42 are connected in series between high power source voltage VDD and low power source voltage VSS. The gate of transistor 41 is connected to floating diffusion region 16. Constant voltage source 43 is connected between the gate of transistor 42 and power source voltage VSS. Transistors 41 and 42, and constant voltage source 43 make up source-follower amplifier 44 for converting the stored charge in floating diffusion region 16 into a signal voltage. This source-follower amplifier 44 is followed by source-follower amplifier 48 of the P channel type. The amplifier 48 is comprised of P channel MOS transistor 46 which is coupled with constant voltage source 45 and serves as a constant current source, and P channel MOS transistor 47 coupled at the gate with the output voltage of amplifier 44. Amplifier 48 is followed by sample/hold circuit 52, which is comprised of P channel MOS transistor 49 and N channel MOS transistor 50, and capacitor 51. The source-drain paths of these transistors 49 and 50 are connected in parallel. The output voltage of amplifier 48 is held in capacitor 51 of sample/hold circuit 52, in synchronism with sampling pulse φSH and the inverted pulse. CMOS inverter 55 is connected to the succeeding stage of sample/hold circuit 52. CMOS inverter 55 is comprised of P channel MOS transistor 53 as a drive transistor and N channel MOS transistor 54 as a load transistor. The voltage held in this sample/hold circuit 52 is inverted and amplified by this inverter 55, and output as output voltage VOUT.

Also in this embodiment, threshold voltage VTH2 of drive MOS transistor 41 of source follower amplifier 44 at the first stage of output circuit 40 is set to be higher than the threshold voltage VTH1 of other MOS transistors of the same conductivity type as that of the former, in order to operate transistor 41 in a saturation region. With this arrangement, if the power source voltage is low, an output voltage can be obtained with good linearity and a wide dynamic range.

The embodiments of FIGS. 2, 5 and 6 each employ bootstrap circuit 8 for pulling up reset pulse φR with respect to power source voltage VDD, for using the pulled-up reset pulse φR. Therefore, in the reset mode, the pulled-up reset pulse φR is applied to reset gate electrode 17, and the potential in reset gate electrode 17 is large. Therefore, the stored charges in floating diffusion region 16 are more reliably discharged into drain region 18. In other words, the signal charge is reliably reset.

Figure 7:
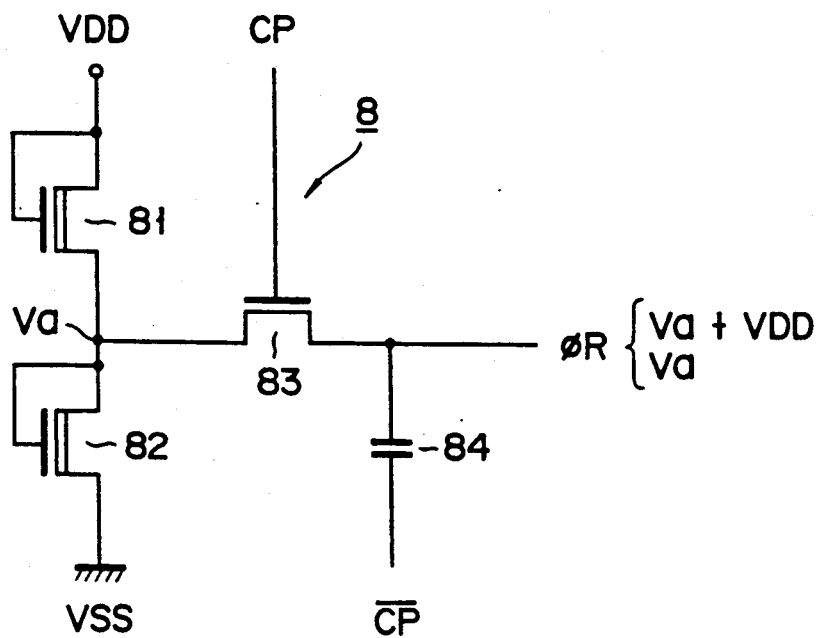
FIG. 7 is a circuit diagram of a bootstrap circuit for the reset pulse, which is applicable for the CTDs of FIGS. 2, 5 and 6.
Figure 8:
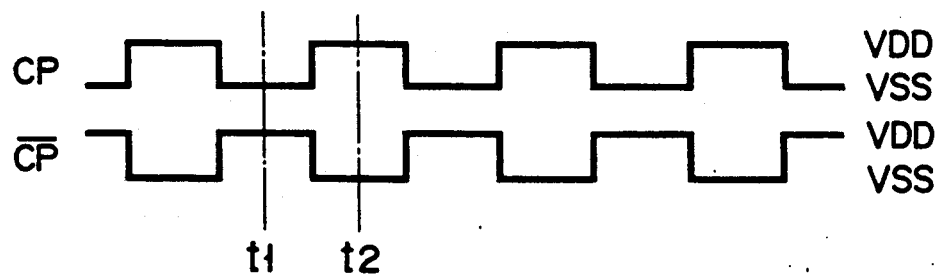
FIG. 8 shows a signal chart of control pulses input to the FIG. 7 bootstrap circuit.

FIG. 7 shows a circuit diagram showing the details of the bootstrap circuit 8 for pulling up reset pulse φR, which is used for the FIG. 5 CTD. A timing chart of control pulses CP and $\overline{CP}$ bar for this bootstrap circuit is shown in FIG. 8.

As shown, D type MOS transistors 81 and 82 are connected in series between high and low power source voltages VDD and VSS. The gates of these transistors 81 and 82 are connected to the higher potential terminals of their drain-source paths, respectively. One end of the drain-source path of E type MOS transistor 83 is connected to an interconnection point of transistors 81 and 82. The other end of the path provides pulled-up reset pulse φR. The gate of MOS transistor 83 is coupled for reception with control pulse CP. One end of capacitor 84 is connected to the other end of transistor 83, while the other end of the capacitor receives control pulse $\overline{CP}$ bar.

In the FIG. 7 bootstrap circuit, divided voltage Va of power source voltage VDD appears at an interconnection point between MOS transistors 81 and 82. When control pulse CP is logically high, MOS transistor 83 is turned on, so that the charges stored in capacitor 84 are discharged through MOS transistors 83 and 82. Consequently, signal voltage Va is output as reset pulse $\phi R$. When control pulse CP goes low, MOS transistor 84 is turned off, and pulled-up signal voltage expressed by Va+VDD is output as reset pulse $\phi R$.

Figure 9:
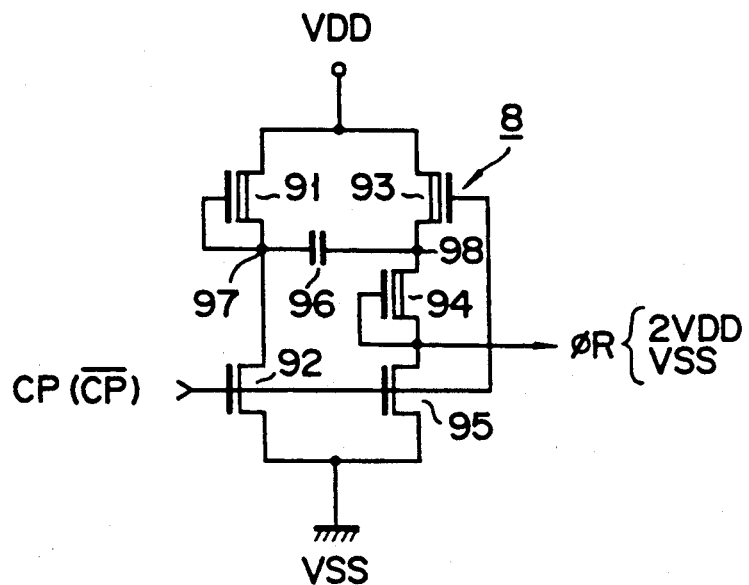
FIG. 9 is a circuit diagram of another bootstrap circuit for the reset pulse.

FIG. 9 shows another circuit arrangement of the bootstrap circuit. This bootstrap circuit is comprised of D type MOS transistors 91, 93, and 94, and E type MOS transistors 92 and 95, and capacitor 96. MOS transistors 91 and 92 are connected in series between power source voltages VDD and VSS. MOS transistors 93 to 95 are also connected in series between these power source voltages. Capacitor 96 is connected between the low potential terminals 97 and 98 of MOS transistors 91 and 93. The gate of MOS transistor 91 is connected to the lower potential terminal. The gate of MOS transistor 94 is connected to the low potential terminal. The pulled-up voltage $\phi R$ from the bootstrap circuit is output through the low potential terminal of transistor 94. Control pulse CP or $\overline{CP}$ bar is input to the gates of transistors 92, 95 and 93. When control pulse CP is logically high, node 97 is logically low, so that transistors 95 and 93 are turned on. As a result, capacitor 96 is charged to the voltage VDD. At this time, output pulse $\phi R$ is at the VSS voltage. When control pulse CP goes low, node 97 goes high and transistors 95 and 93 are turned off. As a result, node 98 is pulled up to "VDD+VDD=2VDD". This potential VDD is output as output voltage $\phi R$ of the bootstrap circuit, via MOS transistor 94. IN this way, this bootstrap circuit produces pulled-up voltage 2VDD two times power source voltage VDD.

Figure 10:
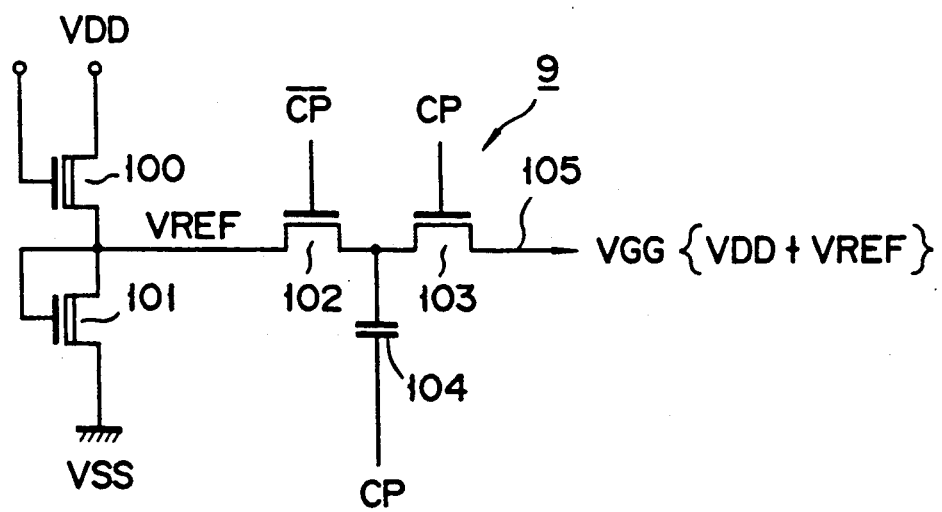
FIG. 10 shows a circuit diagram illustrating the details of the bootstrap circuit used in the CTDs of FIGS. 2, 5 and 6.

The details of the bootstrap circuit 9 for producing reset pulse VGG, which is applicable for the FIGS. 2 and 6 CTD, is shown in FIG. 10. In FIG. 10, reference numerals 100 and 101 designate reference voltage sources for producing reference voltage VREF, which are connected in series between power source voltages VDD and VSS. E type MOS transistor 102 is connected at one end to reference voltage source 101. E type MOS transistor 103 is connected at one end to the other end of transistor 102. Capacitor 104 is connected at one end to the connection point between these transistors. The other end of transistor 103 is connected to the output terminal for providing the pulled-up voltage. The other end of capacitor 104 and the gate of transistor 103 are applied with control pulse CP. The gate of MOS transistor 102 is applied with control pulse $\overline{CP}$ bar. At the time t1 that control pulse CP is logically low, transistor 102 is turned on, and transistor 103 is turned off. Capacitor 104 is charged to reference voltage VREF of reference voltage source, via transistor 102. At the time t2 that control pulse CP is logically high, MOS transistor 102 is turned off, and MOS transistor 103 is turned on. The voltage at output terminal 105 is a pulled-up value of reference potential VREF+the crest value of control pulse CP. Thus, this bootstrap circuit serves as a voltage 2-time multiplier.

As described above, this invention provides a charge transfer device which is stably operable at low voltages while maintaining good linearity and a wide dynamic range.

What is claimed is:

1. A charge transfer device comprising:
    a floating diffusion region formed on a semiconductor substrate, signal charge containing an AC signal voltage being transferred from a charge transfer section to said floating diffusion region, and the AC signal voltage being biased by a DC bias voltage;
    a drain region formed on the semiconductor substrate, for draining unnecessary signal charges in response to a reset voltage;
    reset means formed between said floating diffusion region and said drain region on the semiconductor substrate, said reset means discharging the charges stored in said floating region into said drain region in response to a reset pulse applied thereto;
    an output circuit of the source-follower type including a drive MOS transistor of the enhancement type formed on the semiconductor substrate, the gate of said drive MOS transistor being connected to said floating diffusion region, said output circuit further including a plurality of additional MOS transistors of the enhancement type formed on the semiconductor substrate one of which forms a current source connected to the source of said drive MOS transistor, and said output circuit converting an amount of the charges stored in said floating diffusion region into a voltage value;
    the threshold voltage (VTH) of said drive MOS transistor in said output circuit being set to be larger than that of said additional MOS transistors; and
    the threshold voltage (VTH) of said drive MOS transistor being set to be a value satisfying the following relationship:

$$VTH > VGG - \Delta VFD + \Delta V - VDD$$

where:
    VDD corresponds to a power source voltage applied to said output circuit,
    VGG corresponds to a reset voltage;
    $\Delta V$ corresponds to a voltage of a half cycle of an AC signal of the signal charges,
    $\Delta VFD$ corresponds to a DC bias voltage for biasing the AC signal voltage of the charges so that the charges are transferred to said floating diffusion region, and
    VTH corresponds to a threshold voltage of said drive MOS transistor in said output circuit.

2. The charge transfer device according to claim 1, in which said reset voltage (VGG) has an absolute value larger than that of said power source voltage applied to said output voltage (VDD).

3. The charge transfer device according to claim 1, further comprising a bootstrap circuit for pulling up said reset pulse applied to said floating diffusion region with respect to a high potential power source voltage.

4. The charge transfer device according to claim 1, further comprising means for pulling up said reset pulse applied to said drain region with respect to a high potential power source voltage.

5. The charge transfer device according to claim 3, in which said boot-strap circuit includes a reference voltage generating circuit made up of MOS transistors connected in series between the high potential power source voltage and a low potential power source voltage, a divided voltage appearing at the connection point of said MOS transistors, a MOS transistor with a source-drain path connected at one end to said connection point and at the other end to a signal output terminal, the gate terminal of said MOS transistor being coupled for reception with a first phase control pulse, and a capacitor connected at one end to the other end of the drain-source path of said MOS transistor, and at the other end to a control pulse of a phase opposite to that of said first phase control pulse.

6. The charge transfer device according to claim 3, in which said boot-strap circuit includes first and second MOS transistors connected in series between the high potential power source voltage and a low potential power source voltage, third to fifth MOS transistors connected in series between the high and low power source voltages, and a capacitor connector between lower potential terminals of said first and third MOS transistors, the gate of said first MOS transistor being connected to said lower potential terminal thereof, the gate of said fifth MOS transistor being connected to a lower potential terminal thereof, and the gates of said second, third and fifth MOS transistors being coupled for reception of a control pulse.

7. The charge transfer device according to claim 4, in which said reset pulse pulling-up means includes first and second MOS transistors connected in series between the high potential power source voltage and a low potential power source voltage, third and fourth MOS transistors connected in series between the interconnection point between said first and second MOS transistors and the circuit output terminal, the gates of third and fourth transistors being coupled for reception with first and second control pulses of different phases, and a capacitor coupled at one end to the interconnection point between said third and fourth MOS transistors, and at the other end to the control pulse applied to the gate of said fourth MOS transistor.

8. The charge transfer device according to claim 1, in which said reset pulse applied to said drain region is a voltage pulled up with respect to a high power source voltage.

9. A charge transfer device comprising:
a floating diffusion region formed on a semiconductor substrate, signal charge containing an AC signal voltage transferred from a charge transfer section to said floating diffusion region, and the AC signal voltage being biased by a DC bias voltage;
a drain region formed on the semiconductor substrate, for draining unnecessary signal charges in response to a reset voltage;
reset means formed between said floating diffusion region and said drain region on the semiconductor substrate, said reset means discharging the charges stored in said floating region into said drain region in response to a reset pulse applied thereto;
an output circuit of the source-follower type including a drive MOS transistor of the enhancement type formed on the semiconductor substrate, the gate of said drive MOS transistor being connected to said floating diffusion region, said output circuit further including an enhancement type MOS transistor for current source/load on the semiconductor substrate and connected to the source of said drive MOS transistor, and said output circuit converting an amount of the charges stored in said floating diffusion region into a voltage value;
the threshold voltage of said drive MOS transistor in said output circuit being set to be larger than that of said current source/load MOS transistor; and
the threshold voltage of said drive MOS transistor being set to be a value satisfying the following relationship:

$$VTH > VGG - \Delta VFD + \Delta V - VDD$$

where
VDD corresponds to a power source voltage applied to said output circuit,
VGG corresponds to a reset voltage,
$\Delta V$ corresponds to a voltage of a half cycle of an AC signal of the signal charges,
$\Delta VFD$ corresponds to a DC bias voltage for biasing the AC signal voltage of the charges so that the charges are transferred to said floating diffusion region, and
VTH corresponds to a threshold voltage of said drive MOS transistor in said output circuit.

10. The charge transfer device according to claim 9, in which said reset voltage (VGG) has an absolute value larger than that of said power source voltage applied to said output circuit (VDD).

11. The charge transfer device according to claim 9, further comprising a bootstrap circuit for pulling up said reset pulse applied to said floating diffusion region with respect to a high potential power source voltage.

12. The charge transfer device according to claim 9, further comprising means for pulling up said reset pulse applied to said drain region with respect to a high potential power source voltage.

13. The charge transfer device according to claim 11, in which said boot-strap circuit includes a reference voltage generating circuit made up of MOS transistors connected in series between the high potential power source voltage and a low potential power source voltage, a divided voltage appearing at the connection point of said MOS transistors, a MOS transistor with a source-drain path connected at one end to said connection point and at the other end to a signal output terminal, the gate terminal of said MOS transistor being coupled for reception of a first phase control pulse, and a capacitor connected at one end to the other end of the drain-source path of said MOS transistor, and at the other end to a control pulse of a phase opposite to that of said first phase control pulse.

14. The charge transfer device according to claim 11, in which said boot-strap circuit includes first and second MOS transistors connected in series between the high potential power source voltage and a low potential power source voltage, third to fifth MOS transistors connected in series between the high and low power source voltages, and a capacitor connected between lower potential terminals of said first and third MOS transistors, the gate of said first MOS transistor being connected to said lower potential terminal thereof, the gate of said fifth MOS transistor being connected to a lower potential terminal thereof, and the gates of said second, third and fifth MOS transistors are coupled for reception of a control pulse.

15. The charge transfer device according to claim 12, in which said reset pulse pulling-up means includes first and second MOS transistors connected in series between the high potential power source voltage and a low potential power source voltage, third and fourth MOS transistors connected in series between the interconnection point between said first and second MOS transistors and the circuit output terminal, the gates of said third and fourth transistors being coupled for reception of first and second control pulses of different phases, and a capacitor coupled at one end to the interconnection point between said third and fourth MOS transistors, and at the other end to the control pulse applied to the gate of said fourth MOS transistor.

16. The charge transfer device according to claim 9, in which said reset pulse applied to said floating diffusion region is a voltage pulled up with respect to a high power source voltage.

* * * * *